(12) United States Patent
Kim et al.

(10) Patent No.: US 11,610,956 B2
(45) Date of Patent: Mar. 21, 2023

(54) DISPLAY DEVICE AND METHOD FOR MANUFACTURING THE SAME

(71) Applicant: Samsung Display Co., LTD., Yongin-si (KR)

(72) Inventors: Jae Sik Kim, Hwaseong-si (KR); Ji Young Choung, Hwaseong-si (KR); Jae Ik Kim, Seoul (KR); Yeon Hwa Lee, Hwaseong-si (KR); Joon Gu Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 179 days.

(21) Appl. No.: 17/069,361

(22) Filed: Oct. 13, 2020

(65) Prior Publication Data
US 2021/0118969 A1  Apr. 22, 2021

(30) Foreign Application Priority Data
Oct. 21, 2019  (KR) .......................... 10-2019-0130713

(51) Int. Cl.
*H01L 27/32* (2006.01)
*H01L 51/56* (2006.01)

(52) U.S. Cl.
CPC ...... *H01L 27/3258* (2013.01); *H01L 27/3246* (2013.01); *H01L 27/3276* (2013.01); *H01L 51/56* (2013.01); *H01L 2227/323* (2013.01)

(58) Field of Classification Search
CPC ............ H01L 27/3258; H01L 27/3246; H01L 27/3276; H01L 2227/323; H01L 51/56

USPC .......................................................... 257/40
See application file for complete search history.

(56) References Cited

U.S. PATENT DOCUMENTS

| | | | | |
|---|---|---|---|---|
| 2003/0227021 A1* | 12/2003 | Yamazaki | ........... | H01L 51/5203 438/22 |
| 2010/0084969 A1* | 4/2010 | Choi | .................... | H01L 51/5228 313/504 |
| 2012/0313099 A1* | 12/2012 | Chung | ................ | H01L 27/3276 438/34 |
| 2014/0034921 A1* | 2/2014 | Jinta | .................... | H01L 27/3246 257/40 |
| 2014/0353611 A1* | 12/2014 | Choi | .................... | H01L 51/5262 257/40 |
| 2015/0228700 A1* | 8/2015 | Cho | .................... | H01L 27/3248 257/40 |

(Continued)

FOREIGN PATENT DOCUMENTS

| | | |
|---|---|---|
| KR | 10-2010-0037876 | 4/2010 |
| KR | 10-2015-0102180 | 9/2015 |
| KR | 10-2015-0144890 | 12/2015 |

*Primary Examiner* — Dzung Tran
(74) *Attorney, Agent, or Firm* — Kile Park Reed & Houtteman PLLC

(57) ABSTRACT

A display device includes a thin film transistor disposed on a base substrate, an insulation layer covering the thin film transistor, an organic light-emitting diode disposed on the insulation layer, a bus electrode and an organic fluoride pattern. The organic light-emitting diode includes a first electrode electrically connected to the thin film transistor, an organic light-emitting layer disposed on the first electrode, and a second electrode disposed on the organic light-emitting layer. The bus electrode is disposed on the second electrode. The organic fluoride pattern is disposed adjacent to the bus electrode.

14 Claims, 16 Drawing Sheets

(56) References Cited

U.S. PATENT DOCUMENTS

2016/0308162 A1* 10/2016 Yoo .................... H01L 27/3244
2017/0084881 A1*  3/2017 Choi ................... H01L 27/3276
2018/0226581 A1*  8/2018 Chang ................. H01L 51/5234

* cited by examiner

DISPLAY DEVICE AND METHOD FOR MANUFACTURING THE SAME

CROSS-REFERENCE TO RELATED APPLICATION(S)

This application claims priority to and benefits of Korean Patent Application No. 10-2019-0130713 under 35 U.S.C. § 119, filed in the Korean Intellectual Property Office on Oct. 21, 2019, the entire contents of which are incorporated herein by reference.

BACKGROUND

1. Technical Field

Embodiments relate to a display device and a method for manufacturing a display device.

2. Description of the Related Art

An organic light-emitting display device is able to itself emit light. Because an organic light-emitting display device may have reduced weight and thickness and may include characteristics appropriate for a flexible display device, usage of organic light-emitting display devices is increasing.

An organic light-emitting display device includes an organic light-emitting element for generating light. For example, the organic light-emitting element includes a first electrode, a second electrode and a light-emitting layer disposed between the first electrode and the second electrode.

An electrode of the organic light-emitting element, which may be adjacent to a display surface, may have a relatively small thickness for transmitting a light. In case that an electrode having a small thickness is used as a common electrode, a voltage drop due to energy loss caused by the electrode may occur. In other words, IR drop may be caused due to current (I) passing through increased resistance (R).

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may enable reduced or eliminated IR drops of a display device.

Embodiments may provide a method for manufacturing a display device.

According to an embodiment, a display device may include a thin film transistor disposed on a base substrate, an insulation layer covering the thin film transistor, an organic light-emitting diode disposed on the insulation layer, a bus electrode and an organic fluoride pattern. The organic light-emitting diode may include a first electrode electrically connected to the thin film transistor, an organic light-emitting layer disposed on the first electrode, and a second electrode disposed on the organic light-emitting layer. The bus electrode may be disposed on the second electrode. The organic fluoride pattern may be disposed adjacent to the bus electrode.

In an embodiment, the display device may further include another bus electrode disposed on the second electrode and adjacent to the bus electrode. The organic fluoride pattern may be disposed between the bus electrode and the another bus electrode.

In an embodiment, the organic fluoride pattern may overlap a light-emitting area, and the bus electrode may overlap a non-light-emitting area.

In an embodiment, the organic fluoride pattern may include a perfluorinated compound.

In an embodiment, a thickness of the organic fluoride pattern may be about 10 Å to about 2,000 Å.

In an embodiment, the bus electrode may have a thickness larger than a thickness of the second electrode.

In an embodiment, the bus electrode and the second electrode may include at least one selected from the group consisting of lithium, calcium, silver, aluminum, magnesium, indium tin oxide, indium zinc oxide, zinc tin oxide, indium oxide, zinc oxide and tin oxide.

In an embodiment, the display device may further include a power bus wiring electrically connected to the second electrode. The organic light-emitting diode may be disposed in a display area, and the power bus wiring may be disposed in a peripheral area surrounding the display area.

In an embodiment, the bus electrode may extend into the peripheral area to overlap the power bus wiring in the peripheral area.

In an embodiment, the display device may further include a pixel-defining layer disposed on the insulation layer and including an opening overlapping at least a portion of the first electrode. The bus electrode may be disposed on the pixel-defining layer.

In an embodiment, the display device may further include a capping layer disposed on the organic fluoride pattern.

In an embodiment, the display device may further include a thin film encapsulation layer disposed on the organic fluoride pattern and the bus electrode.

According to an embodiment, a display device may include a light-emitting area, a non-light-emitting area, a light-emitting element, a bus electrode and an organic fluoride pattern. The light-emitting element may include a first electrode, a light-emitting layer disposed on the first electrode, and a second electrode disposed on the light-emitting layer. The bus electrode may be disposed on the second electrode and overlapping the non-light-emitting area. The organic fluoride pattern may be disposed on the second electrode overlapping the light-emitting area.

In an embodiment, the organic fluoride pattern may include a perfluorinated compound.

According to an embodiment, a method for manufacturing a display device may be provided. According to the method, a first electrode may be formed. An organic light-emitting layer may be formed on the first electrode. A second electrode may be formed on the organic light-emitting layer. An organic fluoride pattern may be formed on the second electrode. A bus electrode may be formed by depositing a conductive on an exposed upper surface of the second electrode.

In an embodiment, the forming of the organic fluoride pattern may include forming the organic fluoride pattern to overlap a light-emitting area, and the forming of the bus electrode may include forming the bus electrode to overlap a non-light emitting area.

In an embodiment, the organic fluoride pattern may include a perfluorinated compound.

In an embodiment, a thickness of the organic fluoride pattern may be about 10 Å to about 2,000 Å.

In an embodiment, the bus electrode may have a thickness larger than a thickness of the second electrode.

In an embodiment, the bus electrode and the second electrode may include at least one selected from the group consisting of lithium, calcium, silver, aluminum, magnesium, indium tin oxide, indium zinc oxide, zinc tin oxide, indium oxide, zinc oxide, and tin oxide.

In an embodiment, the bus electrode and the second electrode may be formed through thermal evaporation.

In an embodiment, the forming of the organic fluoride pattern may include forming an organic fluoride layer on the second electrode, and exposing a portion of the organic fluoride layer to a light to decompose an organo-fluorine compound in a light-exposed portion of the organic fluoride layer.

In an embodiment, a UV ray having a wavelength equal to or less than about 250 nm may be used for exposing a portion of the organic fluoride layer to a light.

In an embodiment, forming the organic fluoride pattern may include disposing a deposition mask including an opening on the second electrode, and providing an organo-fluorine compound to a portion of the second electrode, which is exposed through the opening.

In an embodiment, the method may further include removing the organic fluoride pattern to expose at least a portion of the second electrode, and forming a capping layer on the at least the portion of the second electrode.

According to embodiments, a bus electrode may be formed in a non-light-emitting area. Thus, IR drop of a common electrode may be prevented or reduced.

Furthermore, the bus electrode may be formed on (e.g., directly on) the common electrode without using additional wiring or other metal pattern forming a circuit part. Thus, a size of a light-emitting area may be increased, and a margin for designing the circuit part may be improved. Furthermore, a laser drilling for forming a contact, which may be an expensive process, may be omitted, and damage of a light-emitting element therefrom may be prevented.

BRIEF DESCRIPTION OF THE DRAWINGS

Aspects of one or more embodiments will be more clearly understood from the following detailed description taken in conjunction with the accompanying drawings.

DETAILED DESCRIPTION OF THE EMBODIMENTS

A display device and a method for manufacturing a display device according to embodiments will be described hereinafter with reference to the accompanying drawings, in which some embodiments are shown.

The singular forms "a," "an," and "the" are intended to include the plural forms as well, unless the context clearly indicates otherwise.

The terms "comprises", "comprising", "has", "have", "having", "includes", "including", etc. used herein specify the presence of stated features or components, but do not preclude the presence or addition of one or more other features or components.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or.

Terms such as "overlap" may include layer, stack, face or facing, extending over, covering or partly covering or any other suitable term as would be appreciated and understood by those of ordinary skill in the art.

Phrases such as "at least one of" are intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

It will be understood that when a layer, region, or component is referred to as being "on", "formed on", or the like with respect to another layer, region, or component, it can be directly or indirectly formed on the other layer, region, or component. For example, intervening layers, regions, or components may be present.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1:
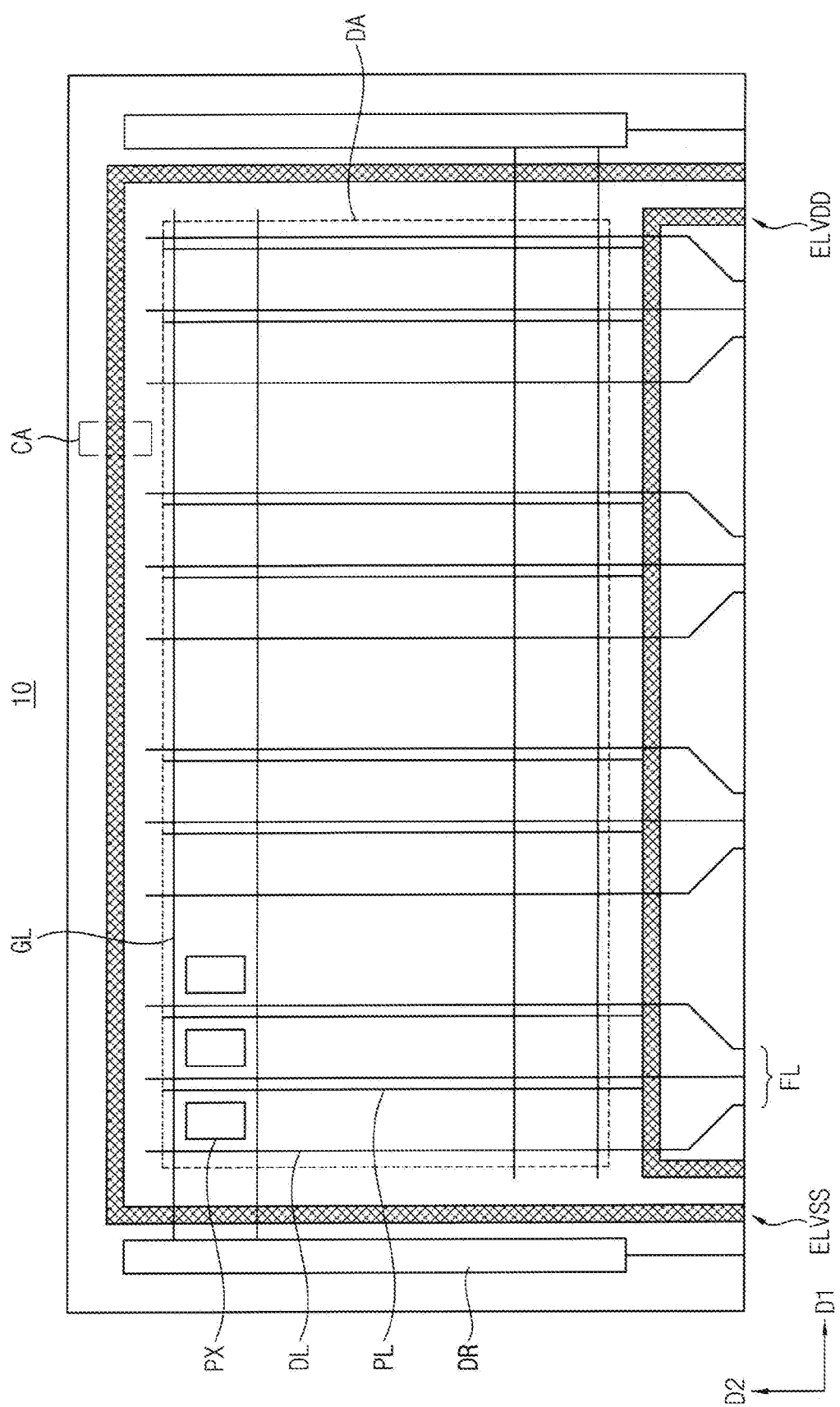
FIG. 1 is a schematic plan view illustrating a display device according to an embodiment.
Figure 2:
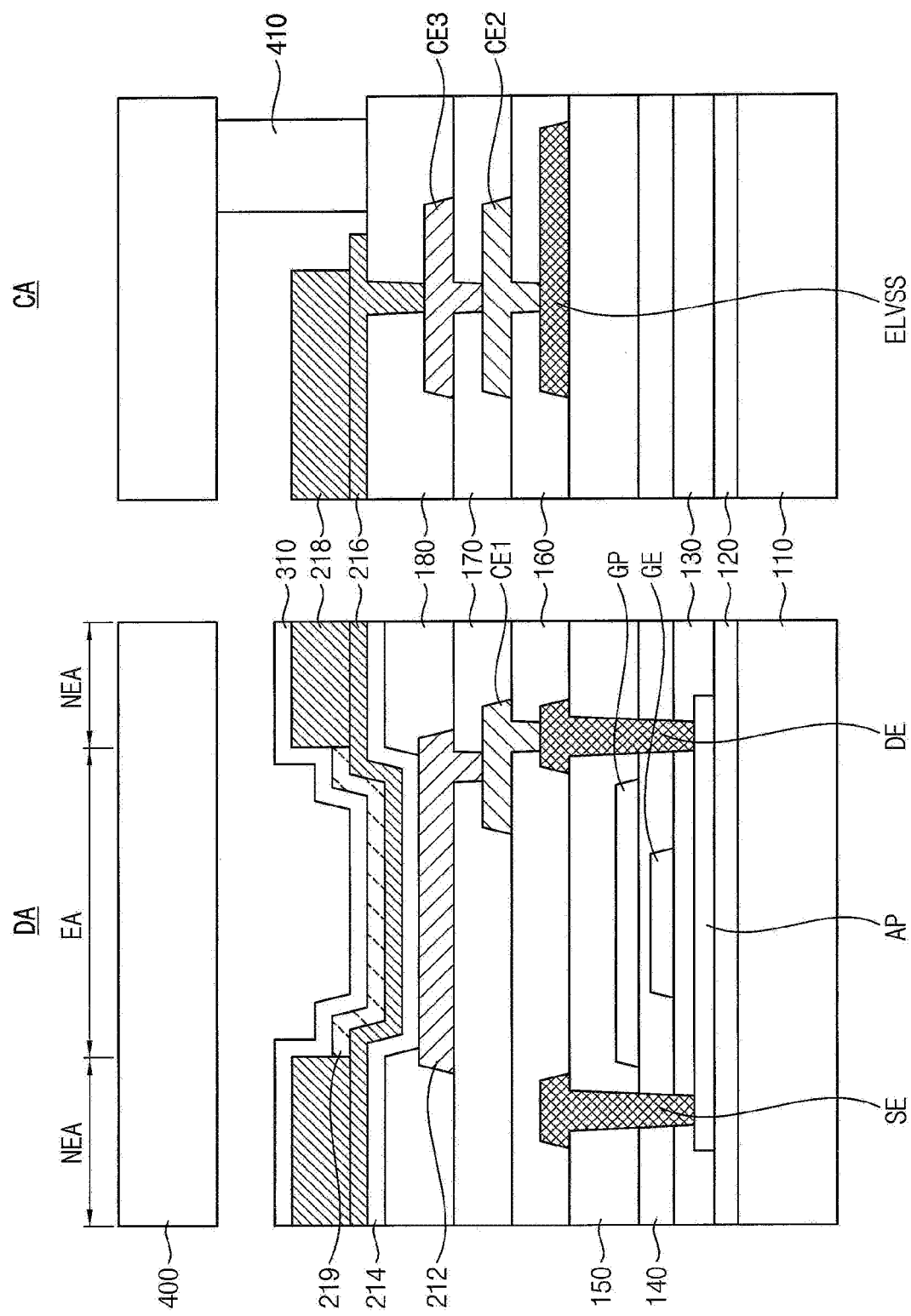
FIG. 2 is a schematic cross-sectional view illustrating a display area and a connection area of a display device according to an embodiment.

FIG. 1 is a schematic plan view illustrating a display device according to an embodiment. FIG. 2 is a schematic cross-sectional view illustrating a display area and a connection area of a display device according to an embodiment.

Referring to FIG. 1, a display device 10 may include a display area DA and a peripheral area which may surround the display area DA. In the display area DA, light may be generated and/or emitted, or transmittance of light provided by an external light source may be adjusted, to display an image. The peripheral area may be defined as an area at which an image may not be displayed.

In an embodiment, the display device 10 may be an organic light-emitting display device. For example, pixels PX including a light-emitting element may be disposed in the display area DA to generate a light in response to a driving signal. A signal wiring and a power wiring may be disposed in the display area DA to transfer a driving signal and a power to the pixels PX. For example, a gate line GL, a data line DL and a power line PL may be disposed in the display area DA. The gate line GL may extend along a first direction D1 and may provide a gate signal to the pixels PX. The data line DL may extend along a second direction D2 crossing the first direction D1 and may provide a data signal to the pixels PX. The power line PL may extend along the second direction D2 and may provide a first power voltage to the pixels PX.

A transfer wiring, a circuit part or the like may be disposed in the peripheral area. The transfer wiring may transfer a driving signal or a power to the display area DA. The circuit part may generate a driving signal. For example, a driver DR generating a gate signal, a fan-out wiring FL transferring a data signal to the data line DL, a first power bus wiring ELVDD transferring a first power voltage to the power line PL, a second power bus wiring ELVSS transferring a second power voltage, or the like may be disposed in the peripheral area. The second power bus wiring ELVSS may electrically contact a common electrode disposed in the display area DA to provide the second power voltage to light-emitting elements in the display area DA. For example, an area, where the second power bus wiring ELVSS electrically contacts the common electrode, may be referred as a connection area CA.

Referring to FIG. 2, a buffer layer 120 may be disposed on a base substrate 110 in the display area DA. An active pattern AP may be disposed on the buffer layer 120. A gate electrode GE may be disposed on the active pattern AP. A first insulation layer 130 may be disposed between the active pattern AP and the gate electrode GE. The first insulation layer 130 may be referred as a first gate insulation layer.

A gate wiring pattern GP may be disposed on the gate electrode GE. The gate wiring pattern GP may include a capacitor electrode, a signal wiring for transferring a driving signal, or the like. A second insulation layer 140 may be disposed between the gate electrode GE and the gate wiring pattern GP. The second gate insulation layer 140 may be referred as a second gate insulation layer. A third insulation layer 150 may be disposed on the gate wiring pattern GP. The third insulation layer 150 may be referred as an interlayer insulation layer.

A source electrode SE and a drain electrode DE may be disposed on the third insulation layer 150. The source electrode SE and the drain electrode DE may pass through the insulation layers disposed thereunder to electrically contact the active pattern AP. A fourth insulation layer 160 may be disposed on a first source metal pattern including the source electrode SE and the drain electrode DE. A fourth insulation layer 160 may be referred as a first via insulation layer.

A second source metal pattern including a first connection electrode CE1 may be disposed on the fourth insulation layer 160. The first connection electrode CE1 may electrically contact the drain electrode DE. The second source metal pattern may further include a mesh power line to compensate for a voltage drop of a power applied to an organic light-emitting diode. A fifth insulation layer 170 may be disposed on the second source metal pattern. The fifth insulation layer 170 may be referred as a second via insulation layer.

An organic light-emitting diode may be disposed on the fifth insulation layer 170. For example, a first electrode 212 of the organic light-emitting diode may be disposed on the fifth insulation layer 170. The first electrode 212 may electrically contact the first connection electrode CE1. In another embodiment, the first connection electrode CE1 may be omitted, and the first electrode 212 may electrically contact the drain electrode DE (e.g., directly).

A pixel-defining layer 180 may be disposed on the fifth insulation layer 170. The pixel-defining layer 180 may include an opening exposing an upper surface of the first electrode 212, and may partially cover the first electrode 212.

An organic light-emitting layer 214 may be disposed on the first electrode 212. A second electrode 216 may be disposed on the organic light-emitting layer 214. The organic light-emitting layer 214 and the second electrode 216 may be continuously formed in the display area DA. Thus, the organic light-emitting layer 214 and the second electrode 216 may be partially disposed on the pixel-defining layer 180. However, embodiments are not limited thereto. For example, the organic light-emitting layer 214 may include patterns separated from each other and respectively disposed on corresponding pixels.

A bus electrode 218 may be disposed on the second electrode 216. The bus electrode 218 may be disposed in a non-light-emitting area NEA. For example, the bus electrode 218 may be disposed on the pixel-defining layer 180. Thus, the bus electrode 218 may have a shape surrounding a light-emitting area EA, in a plan view. For example, the light-emitting area EA may be defined as an area overlapping the opening of the pixel-defining layer 180 or by an area overlapping at least a portion of the first electrode 212. The non-light-emitting area NEA may be defined as a remaining area excluding the light-emitting area EA, for example, an area overlapping an upper surface of the pixel-defining layer 180.

An organic fluoride pattern 219 may be disposed on the second electrode 216 in the light-emitting area EA. For example, the organic fluoride pattern 219 may be disposed adjacent to the bus electrode 218 (e.g., between adjacent bus electrodes 218). The organic fluoride pattern 219 may be used as a mask in case that the second electrode 216 may be formed.

A capping layer 310 may be disposed on the bus electrode 218 and the organic fluoride pattern 219. For example, the capping layer 310 may protect the organic light-emitting diode, and may increase light-extracting efficiency for a light generated by the organic light-emitting diode.

A second power bus wiring ELVSS may be disposed in the connection area CA. For example, the second power bus wiring ELVSS may be disposed on the third insulation layer 150, and may be formed from a same layer as the first source metal pattern.

The second power bus wiring ELVSS may electrically contact a second connection electrode CE2, which may be disposed on the fourth insulation layer 160 and formed from a same layer as the second source metal pattern.

The second connection electrode CE2 may electrically contact a third connection electrode CE3, which may be disposed on the fifth insulation layer 170 and formed from a same layer as the first electrode 212 of the organic light-emitting diode.

The third connection electrode CE3 may electrically contact the second electrode 216 of the organic light-emitting diode, which may extend into the connection area CA.

The bus electrode 218 may extend into the connection area CA, and may be disposed on the second electrode 216 in the connection area CA. In an embodiment, the bus electrode 218 and the second electrode 216 may overlap the second power bus wiring ELVSS in the connection area CA.

As a result, a second power voltage may be provided to the bus electrode 218 and the second electrode 216 from the second power bus wiring ELVSS.

Since the bus electrode 218 may be disposed in the non-light-emitting area NEA, the bus electrode 218 may have a larger thickness than the second electrode 216. Thus, an entire resistance of the second electrode 216 in the display area DA may be reduced thereby reducing IR drop.

A structure including the base substrate 110 to the capping layer 310 may be referred as an array substrate. The array substrate may be combined with a cover substrate 400.

A sealing member 410 may be provided between the cover substrate 400 and the array substrate to combine the cover substrate 400 and the array substrate and to encapsulate the light-emitting elements in the display area DA. For example, the sealing member 410 may be formed from a glass frit or a polymeric curable resin.

A space between the cover substrate 400 and the array substrate may have a vacuum state or may be filled with a gas or a sealing material.

FIGS. 3 to 12 are schematic cross-sectional views illustrating a method for manufacturing a display device according to an embodiment.

Figure 3:
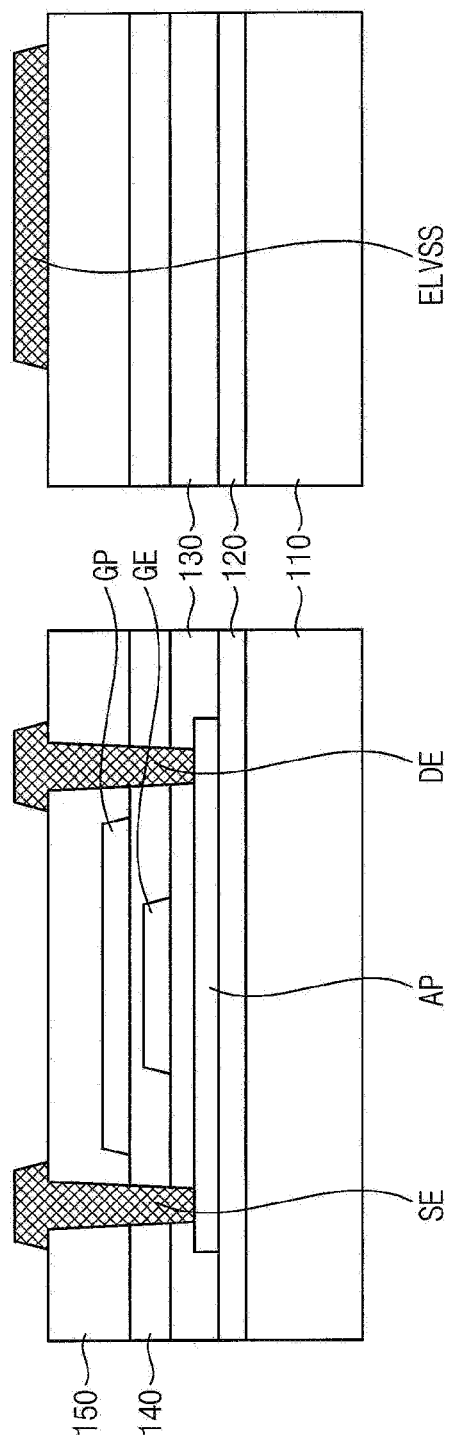
FIGS. 3 to 12 are schematic cross-sectional views illustrating a method for manufacturing a display device according to an embodiment.

Referring to FIG. 3, a buffer layer 120 may be formed on a base substrate 110.

For example, the base substrate 110 may include glass, quartz, silicon, a polymeric material or the like, or a combination thereof. In an embodiment, the base substrate 110 may be a flexible substrate including the polymeric material. For example, the polymeric material may include polyethylene terephthalate, polyethylene naphthalate, polyether ketone, polycarbonate, polyarylate, polyether sulfone, polyimide, or a combination thereof.

The buffer layer 120 may prevent or reduce penetration of impurities, humidity, or external gas from underneath the base substrate 110, and may planarize an upper surface of the base substrate 110. For example, the buffer layer 120 may include an inorganic material such as silicon oxide, silicon nitride, or the like, or a combination thereof.

An active pattern AP may be formed on the buffer layer 120.

For example, the active pattern AP may include a semiconductive material such as amorphous silicon, polycrystalline silicon (polysilicon), a metal oxide, or the like, or a combination thereof. In case that the active pattern AP may include polysilicon, at least a portion of the active pattern AP may be doped with impurities such as n-type impurities or p-type impurities.

In another embodiment, the active pattern AP may include a metal oxide semiconductor. For example, the active pattern AP may include two-component compound (ABx), ternary compound (ABxCy), or four-component compound (ABxCyDz), which contains indium (In), zinc (Zn), gallium (Ga), tin (Sn), titanium (Ti), aluminum (Al), hafnium (Hf), zirconium (Zr), magnesium (Mg), or a combination thereof. For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like, or a combination thereof.

A first insulation layer 130 may be formed on the active pattern AP. A first gate metal pattern including a gate electrode GE may be formed on the first insulation layer 130. The gate electrode GE may overlap the active pattern AP. A second insulation layer 140 may be formed to cover the first gate metal pattern. A second gate metal pattern including a gate wiring pattern GP may be formed on the second insulation layer 140.

For example, the first insulation layer 130 and the second insulation layer 140 may respectively include silicon oxide, silicon nitride, silicon carbide, or a combination thereof. Furthermore, the first insulation layer 130 and the second insulation layer 140 may include an insulating metal oxide such as aluminum oxide, tantalum oxide, hafnium oxide, zirconium oxide, titanium oxide, or the like, or a combination thereof. For example, the first insulation layer 130 and the second insulation layer 140 may respectively have a single-layered structure or a multi-layered structure, which may include silicon nitride and/or silicon oxide.

For example, the first gate metal pattern and the second gate metal pattern may respectively include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multi-layered structure including different metal layers.

A third insulation layer 150 may be formed to cover the second gate metal pattern. A first source metal pattern may be formed on the third insulation layer 150. The first source metal pattern may include a source electrode SE and a drain electrode DE, which may electrically contact the active pattern AP, respectively. For example, the source electrode SE and the drain electrode DE may respectively pass through the third insulation layer 150, the second insulation layer 140 and the first insulation layer 130 to electrically contact the active pattern AP.

The first source metal pattern may further include a second power bus wiring ELVSS. The second power bus wiring ELVSS may be disposed on the third insulation layer 150 in the connection area CA of the peripheral area. As illustrated in FIG. 1, the second power bus wiring ELVSS may have a shape extending along an edge of the display area DA.

For example, the third insulation layer 150 may include an inorganic insulation material. For example, third insulation layer 150 may include silicon oxide, silicon nitride, silicon carbide, or a combination thereof. Furthermore, the third insulation layer 150 may include an insulating metal oxide such as aluminum oxide, tantalum oxide, hafnium oxide, zirconium oxide, titanium oxide, or the like, or a combination thereof.

For example, the first source metal pattern may include gold, silver, aluminum, copper, nickel, platinum, magnesium, chromium, tungsten, molybdenum, titanium, tantalum, or an alloy thereof, and may have a single-layered structure or a multi-layered structure including different metal layers.

Figure 4:
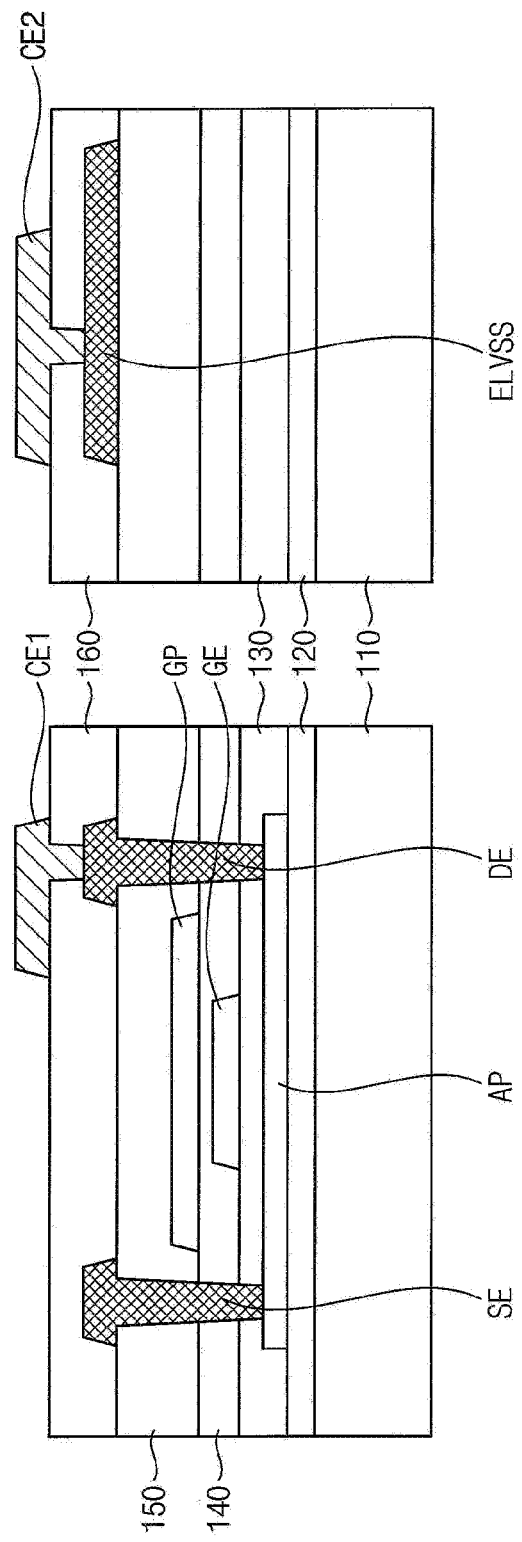

Referring to FIG. 4, a fourth insulation layer 160 may be formed to cover the first source metal pattern. In an embodiment, the fourth insulation layer 160 may include an inorganic insulation material, an organic insulation material, or a combination thereof. For example, the organic insulation material may include a phenol resin, an acryl resin, a polyimide resin, a polyamide resin, an epoxy resin, benzocyclobutene, or the like, or a combination thereof.

A second source metal pattern may be formed on the fourth insulation layer 160. The second source metal pattern may include a first connection electrode CE1 electrically contacting the drain electrode DE. For example, the first connection electrode CE1 may pass through the fourth insulation layer 160 to electrically contact the drain electrode DE. The second source metal pattern may further include a mesh power line to compensate for a voltage drop of a power applied to the organic light-emitting diode.

The second source metal pattern further may include a second connection electrode CE2. The second connection electrode CE2 may be disposed on the fourth insulation layer 160 in the connection area CA, and may pass through the fourth insulation layer 160 to electrically contact the second power bus wiring ELVSS.

For example, the second source metal pattern may include gold, silver, aluminum, copper, nickel, platinum, magnesium, chromium, tungsten, molybdenum, titanium, tantalum, or an alloy thereof, and may have a single-layered structure or a multi-layered structure including different metal layers.

Figure 5:
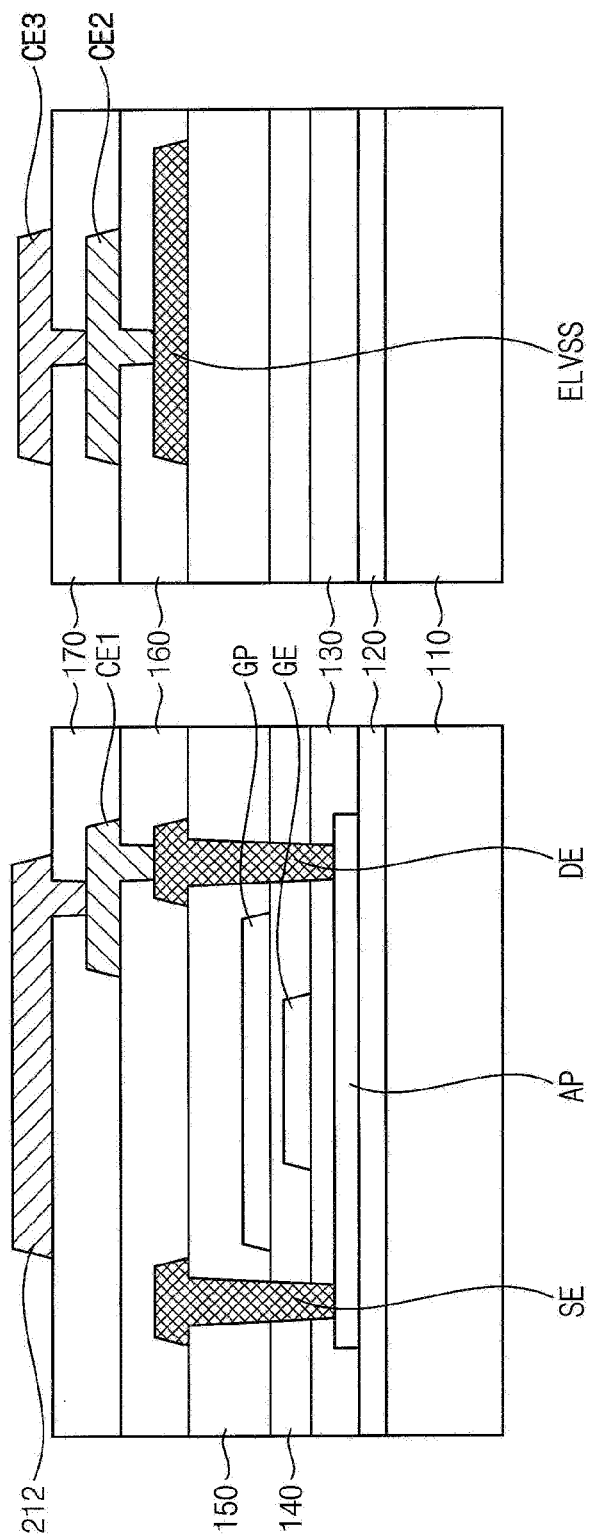

Referring to FIG. 5, a fifth insulation layer 170 may be formed to cover the second source metal pattern. For example, the fifth insulation layer 170 may include an organic insulation material.

A lower electrode pattern may be formed on the fifth insulation layer 170. The lower electrode pattern may include a first electrode 212 of the organic light-emitting diode. The first electrode 212 may function as an anode of the organic light-emitting diode.

The lower electrode pattern may include a metal, a metal oxide, or a combination thereof. For example, the lower electrode pattern may have a multi-layered structure including a metal oxide layer and a metal layer. The metal oxide layer may include indium tin oxide, indium zinc oxide, zinc tin oxide, indium oxide, zinc oxide, tin oxide, or a combination thereof. The metal layer may include gold, silver, aluminum, copper, nickel, platinum, magnesium, chromium, tungsten, molybdenum, titanium, or a combination thereof.

The lower electrode pattern further includes a third connection electrode CE3. The third connection electrode CE3 may be disposed on the fifth insulation layer 170 in the connection area CA, and may pass through the fifth insulation layer 170 to electrically contact the second connection electrode CE2.

Figure 6:
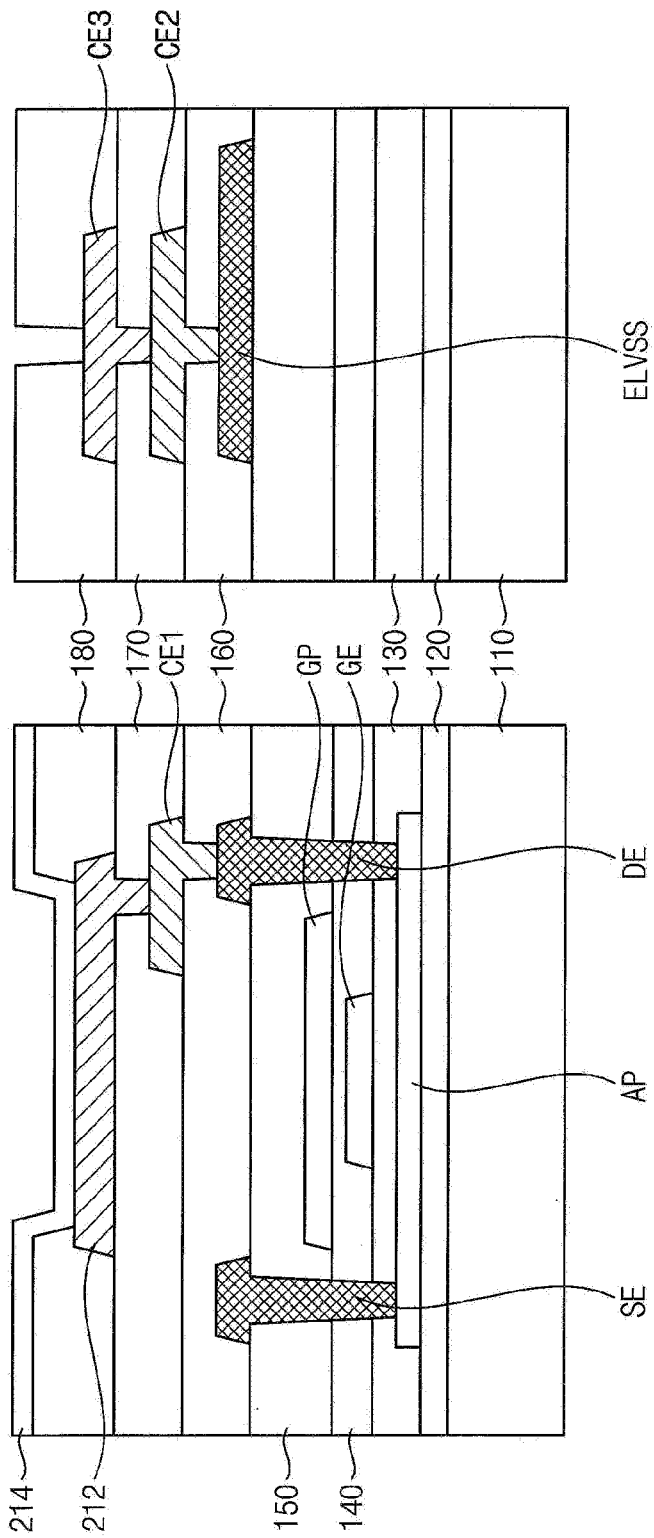

Referring to FIG. 6, a pixel-defining layer 180 may be formed on the fifth insulation layer 170 in the display area DA. The pixel-defining layer 180 may have an opening exposing at least a portion of the first electrode 212. For example, the pixel-defining layer 180 may include an organic insulation material that may be used for forming the fifth insulation layer 170, or the like.

An organic light-emitting layer 214 may be formed on the first electrode 212. For example, at least a portion of the organic light-emitting layer 214 may be formed as a common layer continuously extending in the display area DA. Thus, a portion of the organic light-emitting layer 214 may be disposed on the pixel-defining layer 180. However, embodiments are not limited thereto. For example, the organic light-emitting layer 214 may be formed as patterns separated from each other to overlap corresponding pixels, through deposition using a mask, inkjet printing, or the like.

The organic light-emitting layer 214 may include at least a light-emitting layer, and may further include at least one of a hole injection layer (HIL), a hole transporting layer (HTL), an electron transporting layer (ETL), and an electron injection layer (EIL). For example, the organic light-emitting layer 214 may include a low molecular weight organic compound or a high molecular weight organic compound, or a combination thereof.

In an embodiment, the organic light-emitting layer 214 may emit a red light, a green light, or a blue light. As another example, the organic light-emitting layer 214 may emit a white light. The organic light-emitting layer 214 emitting a white light may have a multi-layered structure including a red-emitting layer, a green-emitting layer, and a blue-emitting layer, or a single-layer structure including a mixture of a red-emitting material, a green-emitting material, and a blue-emitting material.

In an embodiment, the organic light-emitting layer 214 may not be formed in the connection area CA.

In the case that the pixel-defining layer 180 extends into the connection area CA, the pixel-defining layer 180 may have an opening exposing the third connection electrode CE3. In another embodiment, the pixel-defining layer 180 may not be formed in the connection area CA so that an entire upper surface of the third connection electrode CE3 may be exposed.

Figure 7:
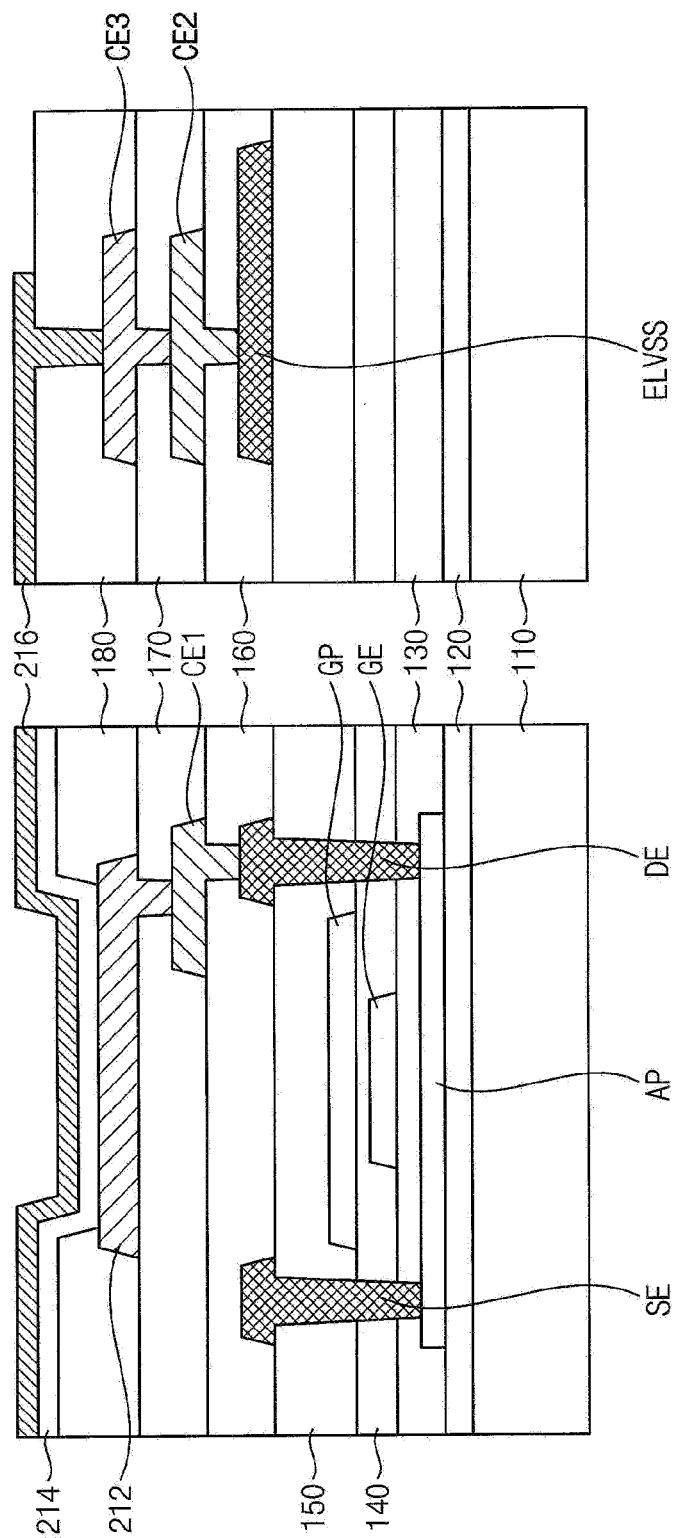

Referring to FIG. 7, a second electrode 216 may be formed on the organic light-emitting layer 214. The second electrode 216 may be formed as a common layer extending over pixels in the display area DA. The second electrode 216 may function as a cathode.

For example, the second electrode 216 may include a metal, a metal oxide, a metal fluoride, or a combination thereof. For example, the second electrode 216 may include lithium, calcium, silver, aluminum, magnesium, indium tin oxide, indium zinc oxide, zinc tin oxide, indium oxide, zinc oxide, tin oxide, or a combination thereof. In an embodiment, the second electrode 216 may include a silver-magnesium alloy.

For example, the second electrode 216 may be formed through thermal evaporation. In an embodiment, the second electrode 216 may have a thickness of about 10 Å to about 100 Å.

In an embodiment, the second electrode 216 may extend into the connection area CA. The second electrode 216 may electrically contact the third connection electrode CE3, which may be exposed. Thus, the second electrode 216 may be electrically connected to the second power bus wiring ELVSS.

Embodiments are not limited to the illustrated configuration. For example, the second power bus wiring ELVSS may be formed from a same layer as the second source metal pattern. For example, at least one of the second connection electrode CE2 and the third connection electrode CE3 may be omitted so that the second electrode 216 may contact the second connection electrode CE2 or the second power bus wiring ELVSS.

Figure 8:
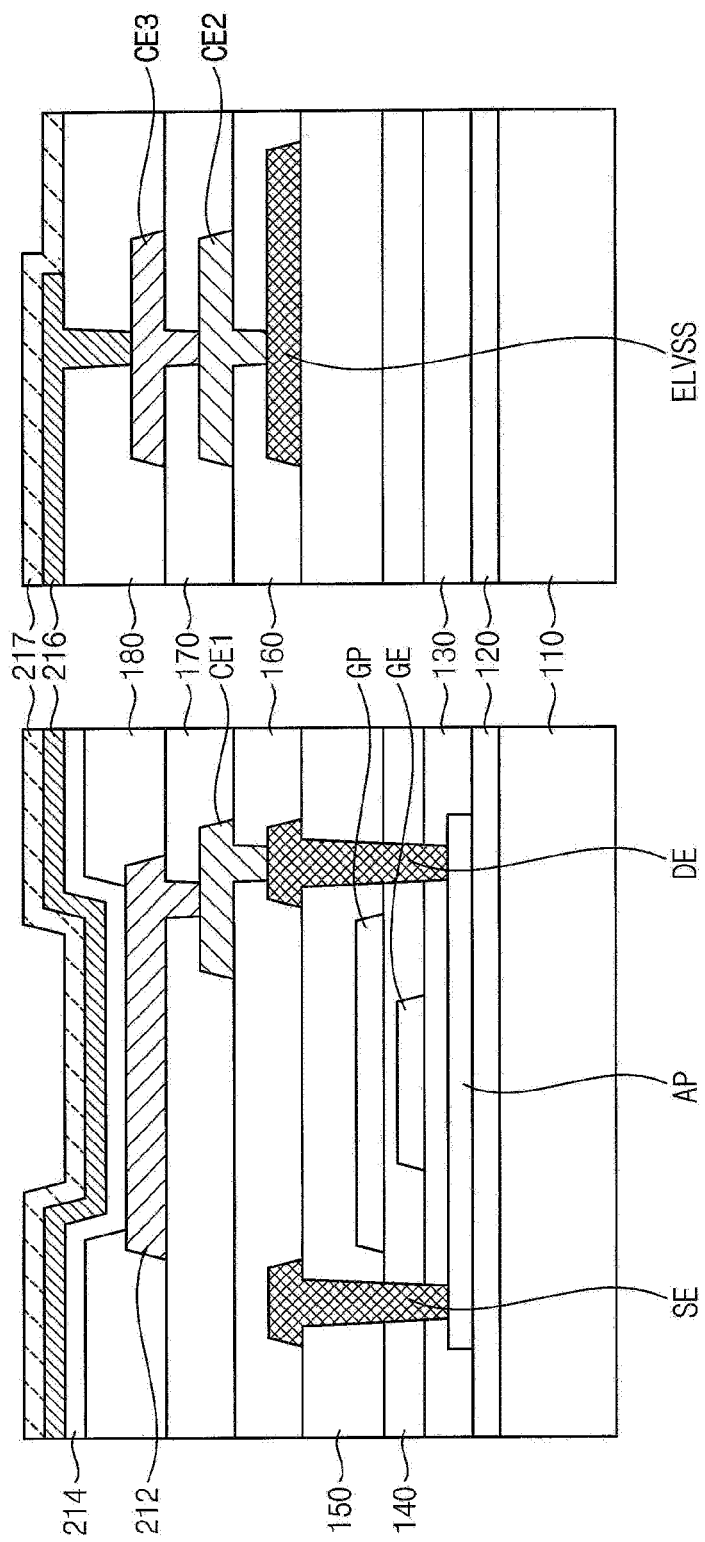

Referring to FIG. 8, an organic fluoride layer 217 may be formed on the second electrode 216.

The organic fluoride layer 217 may include an organo-fluorine compound. For example, the organo-fluorine compound may include a perfluorinated compound. For example, the perfluorinated compound may include perfluorinated carbon.

For example, the perfluorinated compound may include an alkyl chain having a straight shape or a branch shape and a ring structure combined with the alkyl chain.

At least one hydrogen atom of the alkyl chain may be replaced by a fluorine atom. For example, the alkyl chain may include —$CF_3$, —$CHF_2$, —$CH_2F$, —CHF—, —$CF_2$—, or a combination thereof. Furthermore, at least one methylene group of the alkyl chain may be replaced by —CO— or —O—. For example, the number of carbon atoms in the alkyl chain may be about 4 to about 30.

The ring structure may include an aliphatic ring, an aromatic ring, a hetero ring, or a combination thereof. For example, the ring structure may include a cyclohexyl group, a cyclopentyl group, a phenyl group, a naphthyl group, a furyl group, a pyridyl group, or a combination thereof.

At least one hydrogen atom of the ring structure may be replaced by a fluorine atom, an alkyl group having about 1 to about 4 of carbon atoms, a fluoroalkyl group having about 1 to about 4 of carbon atoms or an alkoxysilyl group.

In an embodiment, a thickness of the organic fluoride layer 217 may be about 10 Å to about 2,000 Å. For example, the organic fluoride layer 217 may be formed through thermal evaporation or gas phase deposition.

Figure 9:
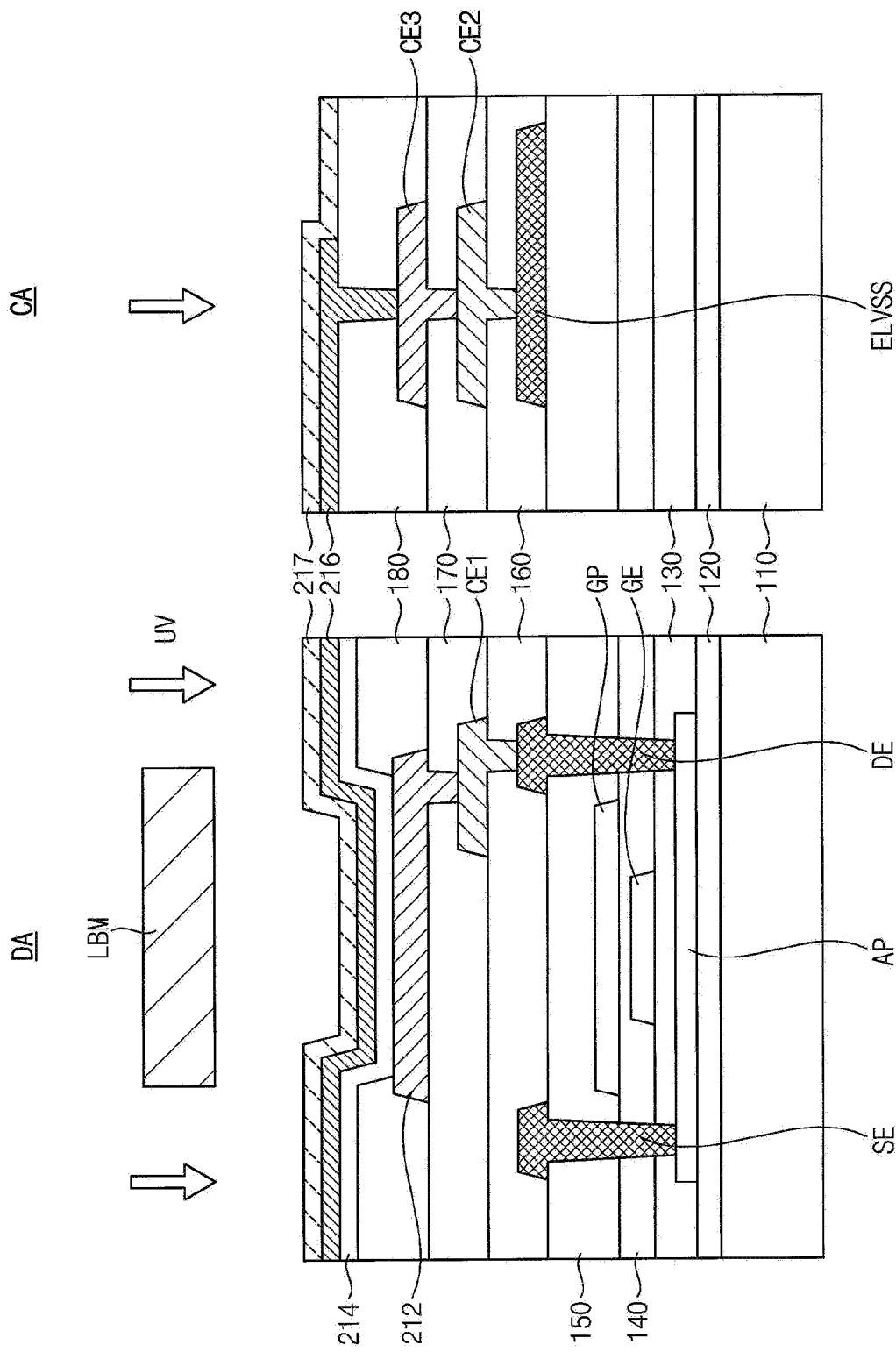

Referring to FIG. 9, the organic fluoride layer 217 may be partially exposed to a light. In an embodiment, a portion of the organic fluoride layer 217, which may correspond to the non-light-emitting area, may be exposed to a light.

For example, a light-blocking mask LBM including a light-blocking area and a light-transmitting area may be disposed on the organic fluoride layer 217. A light may be irradiated onto the organic fluoride layer 217 through the light-blocking mask LBM to expose a portion of the organic fluoride layer 217, which may overlap the light-transmitting area of the mask, to the light.

In an embodiment, the light-blocking area of the mask may overlap the light-emitting area of the display device, and the light-transmitting area of the mask may overlap the non-light-emitting area of the display device. The light-blocking area of the mask may further overlap a portion of the non-light-emitting area of the display device.

In the light-exposed area of the organic fluoride layer 217, an organo-fluorine compound may be decomposed by a light. The light-exposing process may be performed in a vacuum chamber or the like. Thus, the decomposed organo-fluorine compound may be removed from a substrate.

Figure 10:
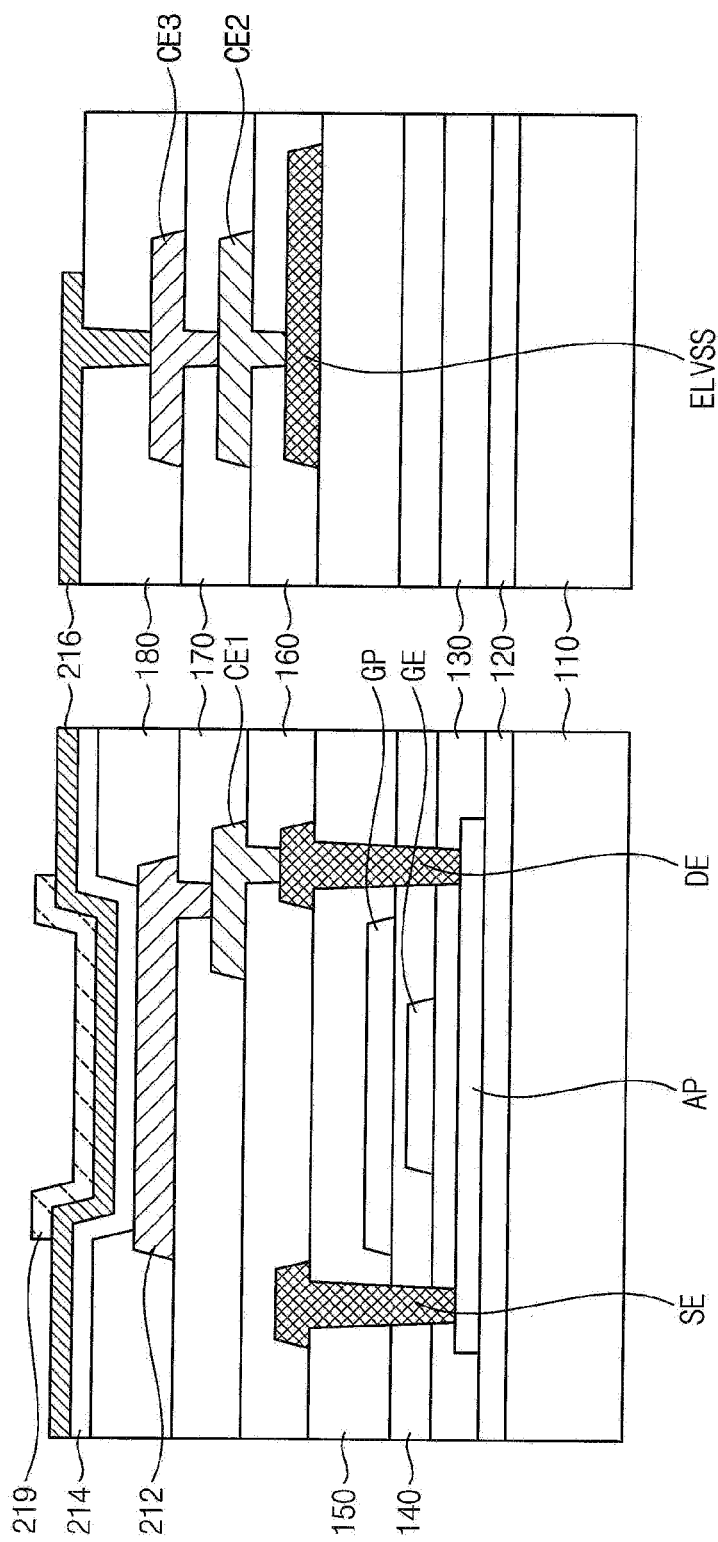

As a result, as illustrated in FIG. 10, the organic fluoride layer 217 may be removed from the non-light-emitting area, which may be exposed to a light, to expose the second electrode 216, and an organic fluoride pattern 219 may be formed in the light-emitting area. As illustrated in FIG. 10, the organic fluoride pattern 219 may correspond to a pixel. However, embodiments are not limited thereto, and a size and a shape of the organic fluoride pattern 219 may be varied depending on a desired design of a bus electrode. For example, the organic fluoride pattern 219 may extend over multiple pixels.

In an embodiment, a UV ray may be used for exposing the organic fluoride layer 217 to a light. For example, a deep UV ray having a wavelength equal to or less than about 250 nm may be used for exposing the organic fluoride layer 217 to a light. The light may have a large energy to easily decompose the organo-fluorine compound.

Figure 11:
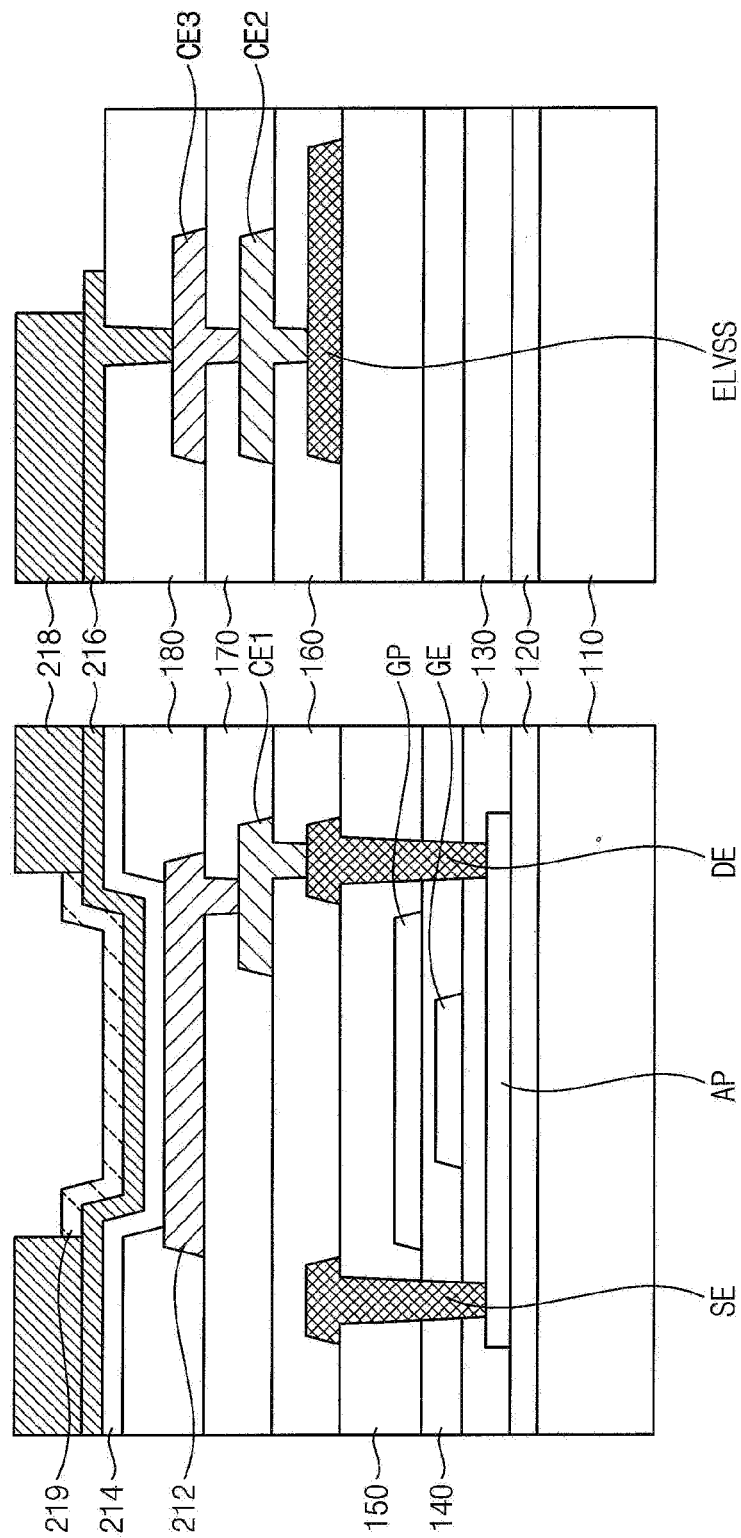

Referring to FIG. 11, a conductive layer may be deposited on the second electrode 216, exposed by removing the organic fluoride layer 217, to form a bus electrode 218.

The bus electrode 218 may include a metal, a metal oxide, a metal fluoride, or a combination thereof. For example, the bus electrode 218 may include lithium, calcium, silver, aluminum, magnesium, indium tin oxide, indium zinc oxide, zinc tin oxide, indium oxide, zinc oxide, tin oxide, or a combination thereof. In an embodiment, the bus electrode 218 may include a silver-magnesium alloy.

For example, the bus electrode 218 may be formed through thermal evaporation. In an embodiment, the second electrode 216 may have a thickness of about 100 Å to about 5,000 Å.

The organic fluoride pattern 219 may have a very small surface energy. Thus, a deposition layer may not be substantially formed on the organic fluoride pattern 219 in the process of depositing the bus electrode 218. For example, a deposition layer may not be formed on the organic fluoride pattern 219, or a deposition layer with a very small thickness may be formed on the organic fluoride pattern 219. Thus, a conductive layer may be selectively deposited on the second electrode 216 so that the bus electrode 218 may be formed without a photolithography process or a deposition mask.

The bus electrode 218 may extend into the connection area CA to electrically contact the second electrode 216 in the connection area CA. Thus, an entire resistance of the second electrode 216 may be reduced thereby reducing or preventing IR drop of the second power voltage provided to the second electrode 216.

An organo-fluorine compound or a decomposed product therefrom may remain on the second electrode 216 under the bus electrode 218. However, an amount thereof may be very small or adjusted so that deposition of the bus electrode 218 may not be hindered and so that a contact resistance between the bus electrode 218 and the second electrode 216 may not be substantially increased.

As illustrated in FIG. 2, a capping layer 310 may be formed on the bus electrode 218 and the organic fluoride pattern 219. In an embodiment, the organic fluoride pattern 219 may not be removed. Thus, the organic fluoride pattern 219 may form a refractivity-matching layer with the capping layer 310, or may be used as a protective layer for the light-emitting element.

For example, the capping layer 310 may include an inorganic material, an organic material, or a combination thereof. For example, the inorganic material may include zinc oxide, tantalum oxide, zirconium oxide, titanium oxide, or the like, or a combination thereof. For example, the organic material may include poly(3,4-ethylenedioxythiophene), PEDOT), 4,4'-bis[N-(3-methylphenyl)-N-phenylamino]biphenyl(TPD), 4,4',4''-tris[(3-methylphenyl)phenylamino]triphenylamine (m-MTDATA), 1,3,5-tris[N,N-bis (2-methylphenyl)-amino]-benzene (o-MTDAB), 1,3,5-tris [N,N-bis(3-methylphenyl)-amino]-benzene (m-MTDAB), or the like, or a combination thereof.

According to embodiments, a bus electrode may be formed in a non-light-emitting area. Thus, IR drop of a common electrode may be prevented or reduced.

Furthermore, the bus electrode may be formed on (e.g., directly on) the common electrode without using additional wiring or other metal pattern forming a circuit part. Thus, a size of a light-emitting area may be increased, and a margin for designing the circuit part may be improved. Furthermore, a laser drilling for forming a contact, which may be an expensive process, may be omitted, and damage of a light-emitting element therefrom may be prevented.

In embodiments, an organic fluoride pattern for forming a low surface energy area may be formed by using a deposition mask such as a fine metal mask instead of a light-decomposing process.

Figure 12:
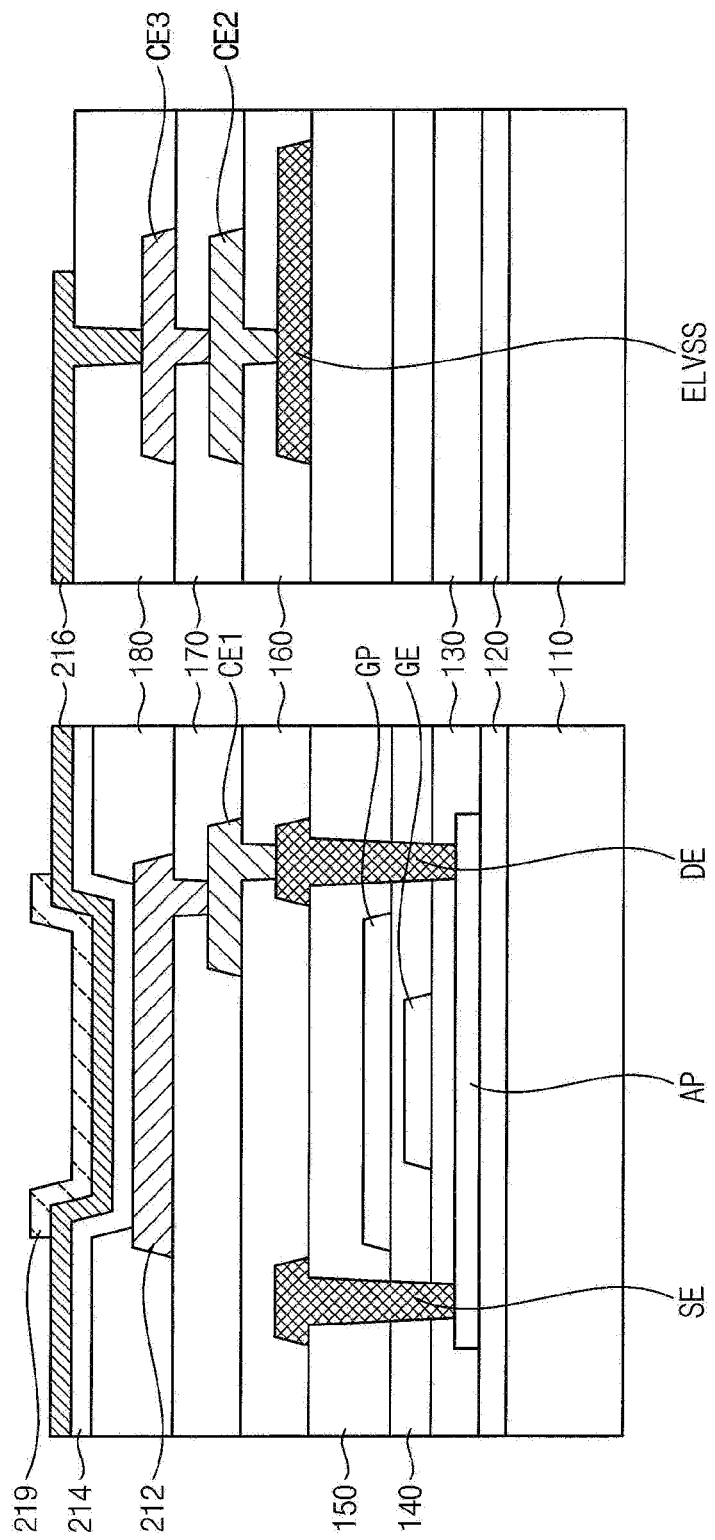

For example, as illustrated in FIG. 12, a deposition mask DM having an opening may be disposed on a second electrode 216, and an organo-fluorine compound may be provided through the deposition mask DM to form an organic fluoride pattern 219 in a desired area.

Figure 13:
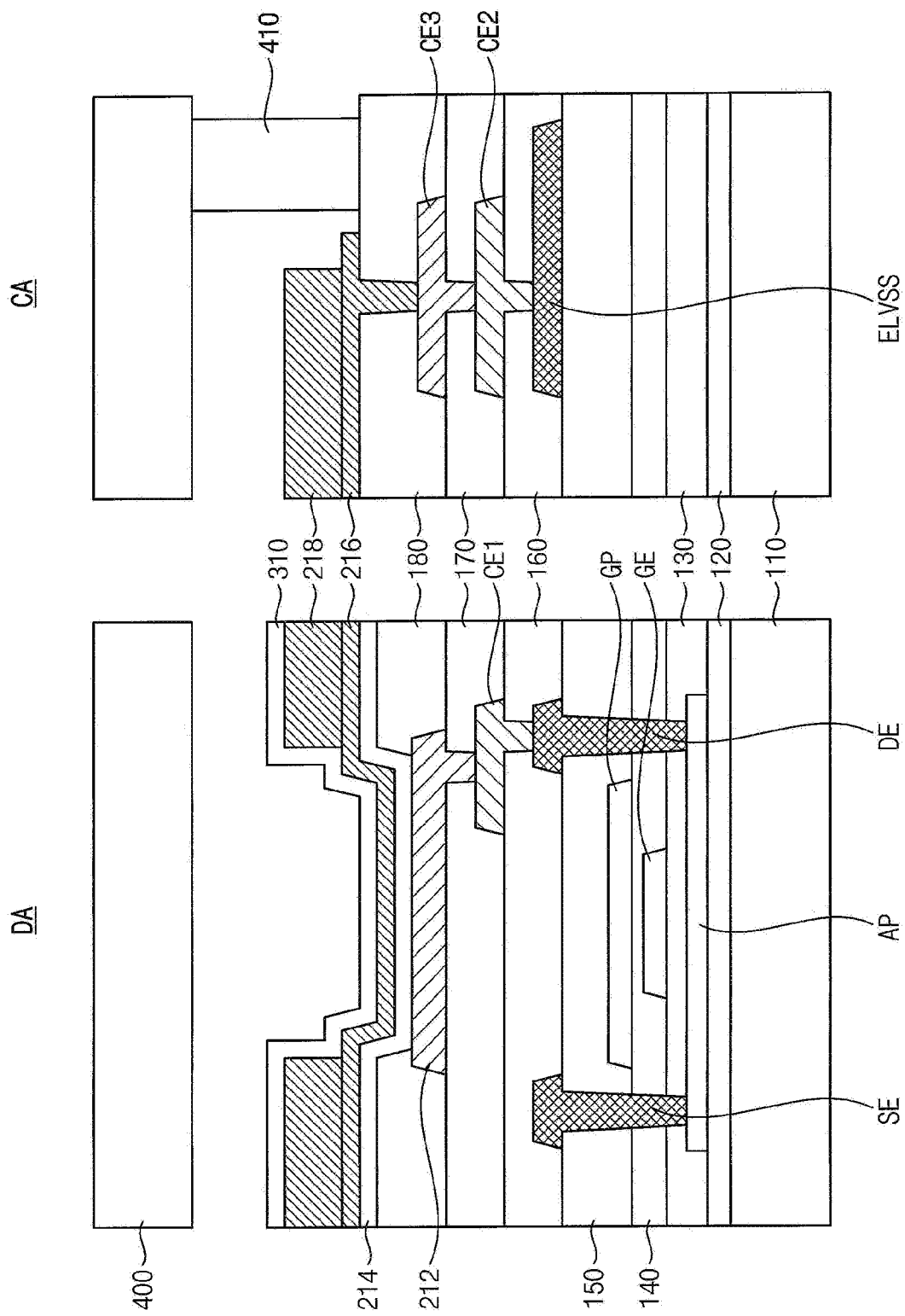
FIGS. 13 and 14 are schematic cross-sectional views illustrating a display device according to embodiments.
Figure 14:
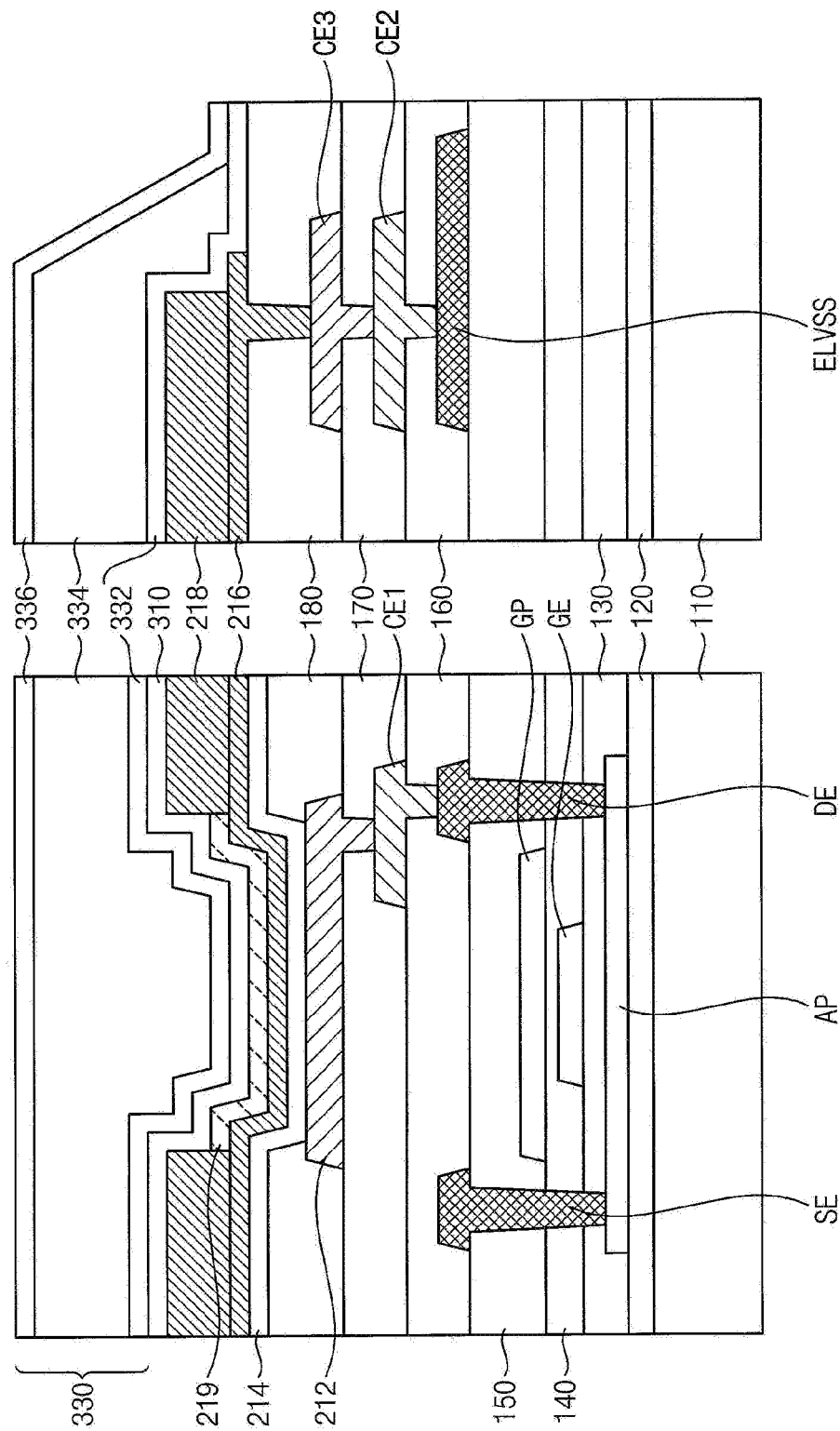

FIGS. 13 and 14 are schematic cross-sectional views illustrating a display device according to embodiments.

In embodiments, an organic fluoride pattern for forming a low surface energy area may be removed as desired. For example, as illustrated in FIG. 13, the organic fluoride pattern may be removed after a bus electrode 218 may be formed, and a capping layer 310 may be formed to contact (e.g., directly contact) a second electrode 216. For example, the organic fluoride pattern may be removed through plasma treatment or the like.

Referring to FIG. 14, a display device may include a thin film encapsulation layer 330. The thin film encapsulation layer 330 may entirely cover an array of organic light-emitting elements in the display area DA, and may extend into a connection area CA.

The thin film encapsulation layer 330 may have a stacked structure including an organic thin film and an inorganic thin film. For example, as illustrated in FIG. 14, the thin film encapsulation layer 330 may include a first inorganic thin film 332, an organic thin film 334 disposed on the first inorganic thin film 332, and a second inorganic thin film 336 disposed on the organic thin film 334. However, embodiments are not limited thereto. For example, the thin film encapsulation layer 330 may include at least two organic thin films and at least three inorganic thin films.

For example, the organic thin film 334 may include a cured resin such as polyacrylate or the like. For example, the cured resin may be formed from cross-linking reaction of monomers. For example, the inorganic thin films 332 and 336 may include an inorganic material such as silicon oxide, silicon nitride, silicon carbide, aluminum oxide, tantalum oxide, hafnium oxide, zirconium oxide, titanium oxide, or the like, or a combination thereof.

Figure 15:
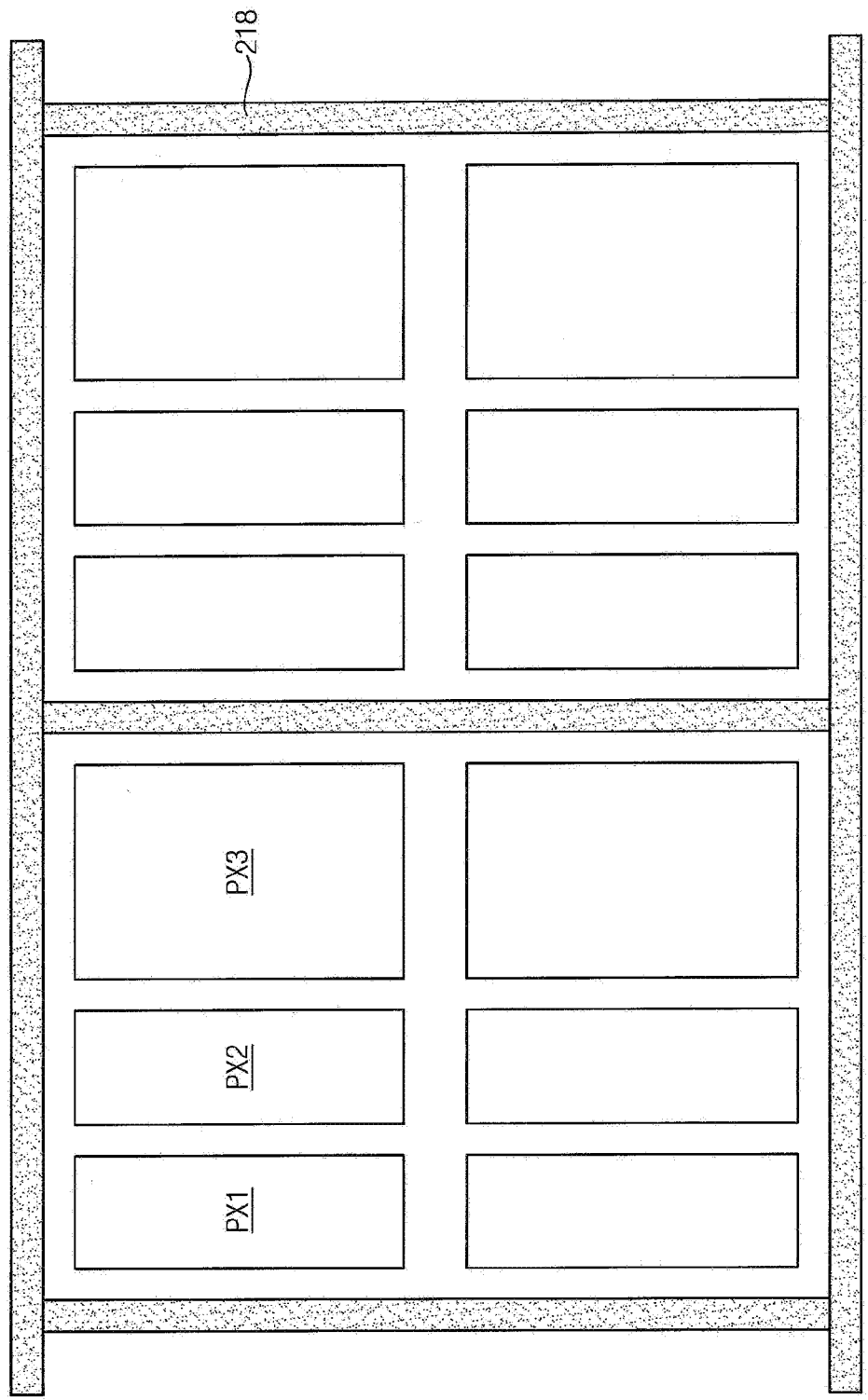
FIGS. 15 and 16 are schematic plan views partially illustrating pixels of a display device according to embodiments.
Figure 16:
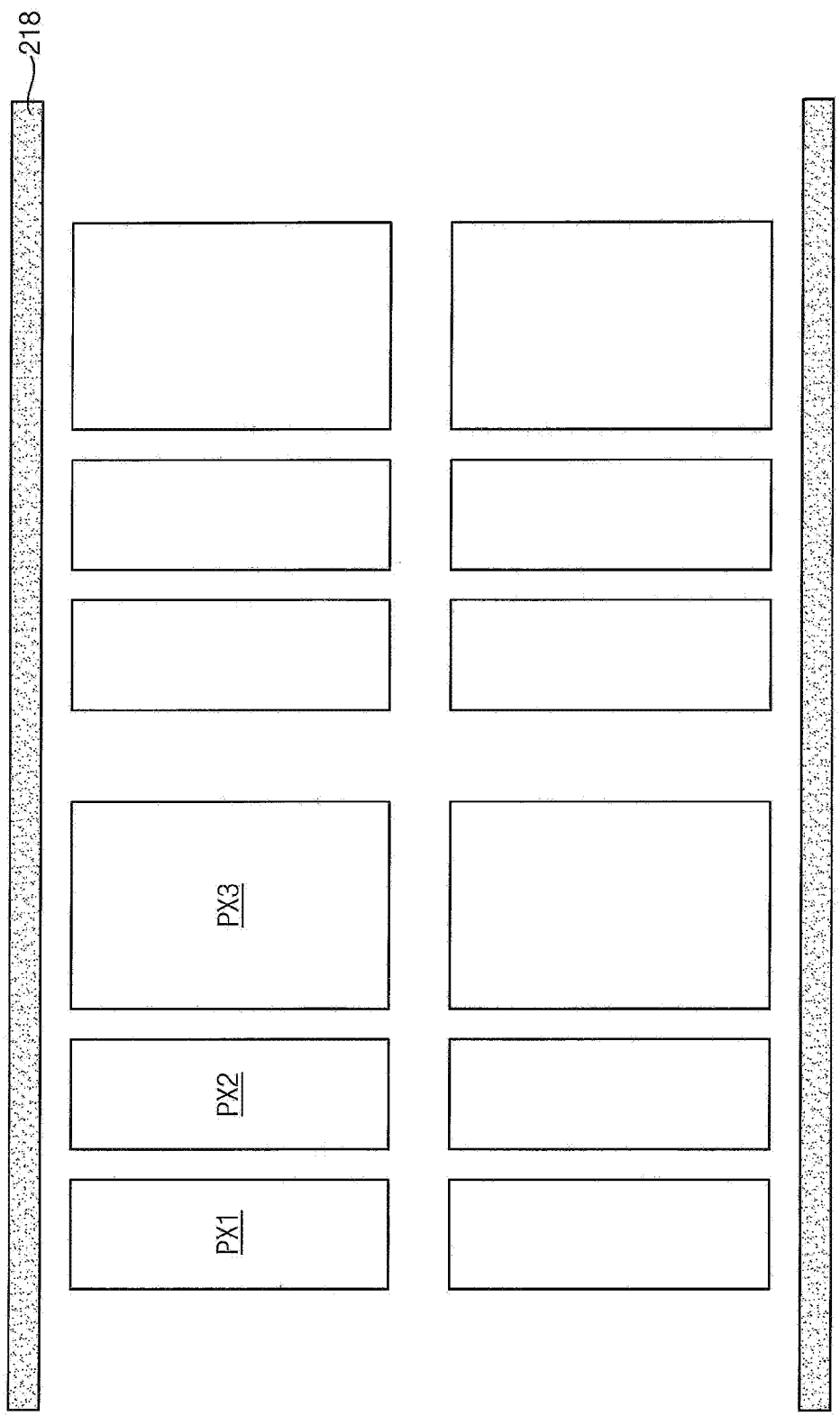

FIGS. 15 and 16 are schematic plan views partially illustrating pixels of a display device according to embodiments.

Referring to FIGS. 15 and 16, a pixel may include subpixels emitting lights having different colors from each other. For example, FIGS. 15 and 16 may illustrate light-emitting areas for subpixels.

For example, a pixel may include a first subpixel PX1, a second subpixel PX2, and a third subpixel PX3. For example, the first subpixel PX1 may emit a red light, the second subpixel PX2 may emit a green light, and the third subpixel PX3 may emit a blue light.

Embodiments are not limited to the illustrated configuration, and embodiments may be applied to a display device with various pixel arrangements, which may be conventionally known. For example, each of the subpixels may have various shapes such as a rectangular shape, a square shape, a circular shape, a rhombus shape, or the like. The subpixels may have a same size, or may have different sizes or different shapes from each other.

The bus electrode 218 may be designed to have an appropriate configuration depending on a configuration of pixels, a shape of subpixels, a size of a display device or the like.

For example, as illustrated in FIG. 15, the bus electrode 218 may have a shape surrounding multiple subpixels or multiple pixels. Furthermore, as illustrated in FIG. 16, the bus electrode 218 may have a linear shape extending along a direction.

In case that a display device includes an organic fluoride pattern, the organic fluoride pattern may be disposed between adjacent bus electrodes 218 to overlap multiple subpixels or multiple pixels.

Embodiments may be applied to various display devices. In an embodiment, for example, embodiments may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the disclosure, as set forth in the following claims and equivalents thereof.

What is claimed is:

1. A display device comprising:
a thin film transistor disposed on a base substrate;
an insulation layer covering the thin film transistor;
an organic light-emitting diode disposed on the insulation layer, the organic light-emitting diode including:
a first electrode electrically connected to the thin film transistor;
an organic light-emitting layer disposed on the first electrode; and
a second electrode disposed on the organic light-emitting layer;
a bus electrode disposed on the second electrode; and
an organic fluoride pattern disposed adjacent to the bus electrode.

2. The display device of claim 1, further comprising another bus electrode disposed on the second electrode and adjacent to the bus electrode, wherein the organic fluoride pattern is disposed between the bus electrode and the another bus electrode.

3. The display device of claim 1, wherein
the organic fluoride pattern overlaps a light-emitting area, and
the bus electrode overlaps a non-light-emitting area.

4. The display device of claim 3, wherein the organic fluoride pattern includes a perfluorinated compound.

5. The display device of claim 4, wherein a thickness of the organic fluoride pattern is about 10 Å to about 2,000 Å.

6. The display device of claim 1, wherein the bus electrode has a thickness larger than a thickness of the second electrode.

7. The display device of claim 6, wherein the bus electrode and the second electrode includes at least one selected from the group consisting of lithium, calcium, silver, aluminum, magnesium, indium tin oxide, indium zinc oxide, zinc tin oxide, indium oxide, zinc oxide, and tin oxide.

8. The display device of claim 1, further comprising a power bus wiring electrically connected to the second electrode, wherein
the organic light-emitting diode is disposed in a display area, and
the power bus wiring is disposed in a peripheral area surrounding the display area.

9. The display device of claim 8, wherein the bus electrode extends into the peripheral area to overlap the power bus wiring in the peripheral area.

10. The display device of claim 1, further comprising a pixel-defining layer disposed on the insulation layer and including an opening overlapping at least a portion of the first electrode, wherein the bus electrode is disposed on the pixel-defining layer.

11. The display device of claim 1, further comprising a capping layer disposed on the organic fluoride pattern.

12. The display device of claim 1, further comprising a thin film encapsulation layer disposed on the organic fluoride pattern and the bus electrode.

13. A display device comprising:
a light-emitting area;

a non-light-emitting area;
a light-emitting element including:
   a first electrode;
   a light-emitting layer disposed on the first electrode; and
   a second electrode disposed on the light-emitting layer;
a bus electrode disposed on the second electrode and overlapping the non-light-emitting area; and
an organic fluoride pattern disposed on the second electrode overlapping the light-emitting area.

14. The display device of claim 13, wherein the organic fluoride pattern includes a perfluorinated compound.

* * * * *